(12) United States Patent
Grillo

(10) Patent No.: US 7,092,039 B2
(45) Date of Patent: Aug. 15, 2006

(54) CALIBRATION DEVICE FOR A VIDEO INPUT STAGE

(75) Inventor: Lionel Grillo, Meylan (FR)

(73) Assignee: STMicroelectronics S.A., Montrouge (FR)

(*) Notice: Subject to any disclaimer, the term of this patent is extended or adjusted under 35 U.S.C. 154(b) by 489 days.

(21) Appl. No.: 10/356,350

(22) Filed: Jan. 30, 2003

(65) Prior Publication Data
US 2003/0174249 A1 Sep. 18, 2003

(30) Foreign Application Priority Data
Jan. 31, 2002 (FR) .................. 02 01172

(51) Int. Cl.
*H04N 5/52* (2006.01)
*H04N 5/16* (2006.01)

(52) U.S. Cl. .............. 348/678; 348/572; 348/691

(58) Field of Classification Search ........ 348/572, 348/573, 678, 682, 679, 691, 695, 697; 341/113–116, 341/120, 126, 155, 156, 164, 172; H04N 5/52, H04N 5/16, 5/18

See application file for complete search history.

(56) References Cited

U.S. PATENT DOCUMENTS

| | | | | |
|---|---|---|---|---|
| 4,831,378 A * | 5/1989 | Baars et al. | ................ | 348/572 |
| 5,731,771 A | 3/1998 | Chesneau | ................ | 341/118 |
| 6,049,355 A | 4/2000 | Kameyama | ................ | 348/241 |
| 6,118,830 A | 9/2000 | Thies et al. | ................ | 375/319 |
| 6,492,921 B1 * | 12/2002 | Kunitani et al. | ............ | 341/155 |

FOREIGN PATENT DOCUMENTS

| | | |
|---|---|---|
| EP | 0 926 887 A2 | 6/1999 |
| JP | 11-146229 | 5/1999 |

* cited by examiner

*Primary Examiner*—Sherrie Hsia
(74) *Attorney, Agent, or Firm*—Lisa K. Jorgenson; Dennis M. de Guzman; Seed IP Law Group PLLC

(57) ABSTRACT

A calibration device for a video circuit input stage comprises an analog-to-digital converter and an input capacitor constantly discharged by a power source and recharged by a charging circuit by means of a first and a second charging current. The charging circuit is controlled by a central processing unit receiving an estimate of the variation between the converter's output code and a clamp value.

26 Claims, 5 Drawing Sheets

CALIBRATION DEVICE FOR A VIDEO INPUT STAGE

BACKGROUND OF THE INVENTION

1. Field of the invention

The present invention relates to video processing input stages and more particularly to a calibration device for an input stage for processing video signals.

2. Description of the Related Art

Input stages for processing video signals typically comprise a calibration circuit for calibrating downstream-located circuits in the receiver and for avoiding any saturation of these circuits. A reference signal—corresponding to black coding—is used right after the line synchronization signal of the video signal, and the receiving circuit uses this black reference to calibrate its internal circuits in order to avoid any saturation.

Two solutions are typically implemented in designing such a circuit, according to whether an analog or digital architecture is preferred.

FIG. 1 shows a flowchart of an analog architecture. The circuit comprises a capacitor 2 for eliminating the continuous component from an input signal presented on a line 1. Capacitor 2 can be charged and discharged by a <<I-8I>> assembly of two power sources 3 and 4 that respectively allow to feed or draw current in order to set the voltage downstream from capacitor 2 to an adequate value. Thus, the video signal—with a correctly set continuous component—can be injected into an analog filter 6 that extracts black level therefrom, and the video signal is then presented to the input of an analog-to-digital converter A/D 5 producing a N-bit digital code.

Generally, for the reception of the reference signal corresponding to black, one tries to ensure an average coding equal to 0 (on N bits) in order to profit from the dynamics of the coding system and thus to avoid its saturation. To this end, a comparator 7 is used to compare the output voltage of filter 6 with a reference voltage Vref, and to produce a control signal controlling power source 4 and inverter element 8 that controls the other power source 3.

The analog structure design is of great simplicity. However, this structure has several crippling disadvantages. Indeed, voltages tend to drift, which degrades the precision of the circuit. Besides, the existence of an offset voltage in comparator 7 worsens this disadvantage. In addition, convergence of the working point, which is set by the value of I-8Icurrents, is not very fast. Moreover, in this circuit, assembly I-8Ifunctions continuously: a current is generated either by source 3, or by source 4 resulting in an oscillation with considerable amplitude around the ideal point, which further degrades the circuit's precision.

To improve calibration precision, an "all digital" architecture is chosen, which requires a great amount of digital signal processing. An example of such an architecture is given in FIG. 2, which shows that circuit <<I-8I>> can be controlled by a digital central processing unit 24 by means of two control signals UP and DOWN that directly control sources 3 and 4, respectively. Downstream from the coupling capacitor 2, the video signal is amplified by a VGA amplifier 23 and the amplified signal can then be directly fed into analog-to-digital converter 5. N-bit coded digital samples are then adequately processed by central processing unit 24 that extracts the level of black and compares it with the reference voltage in order to determine control signals UP and DOWN.

Clearly, the use of a digital architecture as the one in FIG. 2 makes it possible to considerably increase precision in adjusting the input voltage to the A/D converter. It further allows to precisely control the adjusting rate to the reference voltage. On the other hand, part of the complexity of the process has been transferred since digital processing is now necessary to carry out the extraction of the level of black, which, in practice, is actually a delicate task to perform.

Consequently it is desirable to design an input stage for a video signal which makes it possible to benefit from the precision conferred by digital processing, while minimizing the complexity of the digital calculation to be implemented.

BRIEF SUMMARY OF THE INVENTION

An embodiment of the present invention provides an input stage for a video circuit allowing adjustment of the input voltage to the analog-to-digital converter with a high degree of accuracy, while particularly reducing the digital processing needed.

Another embodiment of this invention provides a simple and cost-effective calibration circuit for a video stage.

One embodiment of the present invention provides a calibration device for a video circuit input stage comprising an input capacitor and a charging circuit generating at least a first (COARSE) and a second (FINE) capacitor charging current. The charging circuit is controlled by at least a first and a second control signal, respectively. A power source continuously discharges the capacitor. The video signal is transformed by a video signal transform stage and is then sent to an analog-to-digital converter (ADC) to generate a digital output code. This code is compared by a comparator receiving a clamp value (CLAMP), a comparison result is transmitted to a central processing unit that generates at least a first, and a second control signal for controlling said charging circuit.

Thus, it is not necessary to extract the level of black to clamp or adjust the voltage of the video input signal any more. It can very easily be done by controlling the sync trough of the video signal.

A charging circuit generating two charging currents $I_{COARSE}$ and $I_{FINE}$ is used, and the first charging current has a value allowing to rapidly recharge the input capacitor whereas the second charging current has a value allowing slow recharging of said capacitor.

In an embodiment, the first control signal associated with charging current $I_{COARSE}$ is generated when said AD converter's output code is lower than the clamp value received by comparator by more than one given threshold. The second control signal is generated when the AD converter's output code is lower than this clamp, but is still in a limited neighborhood around said clamp value.

Thus, two different speeds for voltage control of sync troughs are possible, allowing to ensure a fast control during start transient, followed by an extremely precise fine control in steady state.

More particularly, the first control signal (COARSE) is generated when:

$e < -\text{THRESHOLD}$ with e=Code−CLAMP, where Code is the output of the converter; THRESHOLD is the value corresponding to said threshold and CLAMP is the clamp value received by the comparator.

The second control signal (FINE) is generated when:

$-\text{THRESHOLD} < e < 0$

The circuit has a counting unit receiving the second control signal (FINE) for blocking generation of the first and second control signals of the charging circuit after expiry of a time after the appearance of said second control signal (FINE).

One embodiment of the invention also allows realization of a symmetrical structure in which the current circuit discharges a capacitor that is permanently charged by a power source. More specifically, it is provided a calibration device including:

an input capacitor;
a charging circuit generating at least a first (COARSE) and a second (FINE) current discharging said capacitor, and controlled by at least a first and a second control signal, respectively;
a power source for charging said capacitor;
a video signal transform stage;
an analog-to-digital converter generating a digital code in response to said video signal;
a comparator for comparing said converter output code with a clamp value (CLAMP);
a central processing unit generating said control signals from the variation noted between said code and said clamp value.

In this case, the first discharging current is selected so as to allow fast discharging of the capacitor and the second discharging current makes it possible to refine the setting of the capacitor voltage.

The first control signal is generated when the output code of said analog-to-converter digital is higher than the clamp value received by comparator by more than one given threshold value.

BRIEF DESCRIPTION OF THE SEVERAL VIEWS OF THE DRAWINGS

Other characteristics of embodiments of the present invention will appear when reading the following description and drawings, only given by way of nonrestrictive examples. In the appended drawings.

DETAILED DESCRIPTION OF THE INVENTION

Embodiments of a calibration device for a video input stage are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
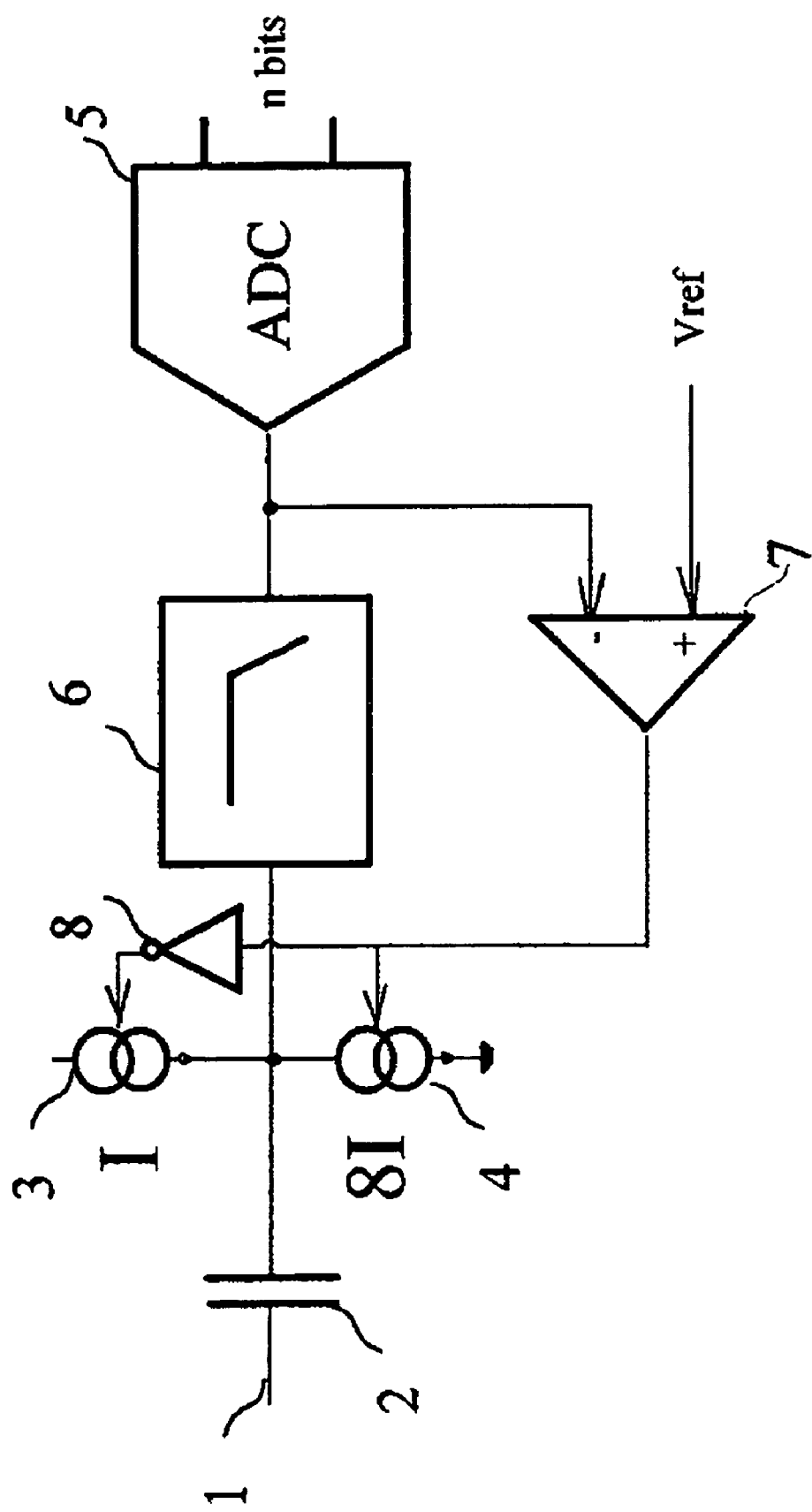
FIG. 1 illustrates an analog architecture of a calibration circuit.
Figure 2:
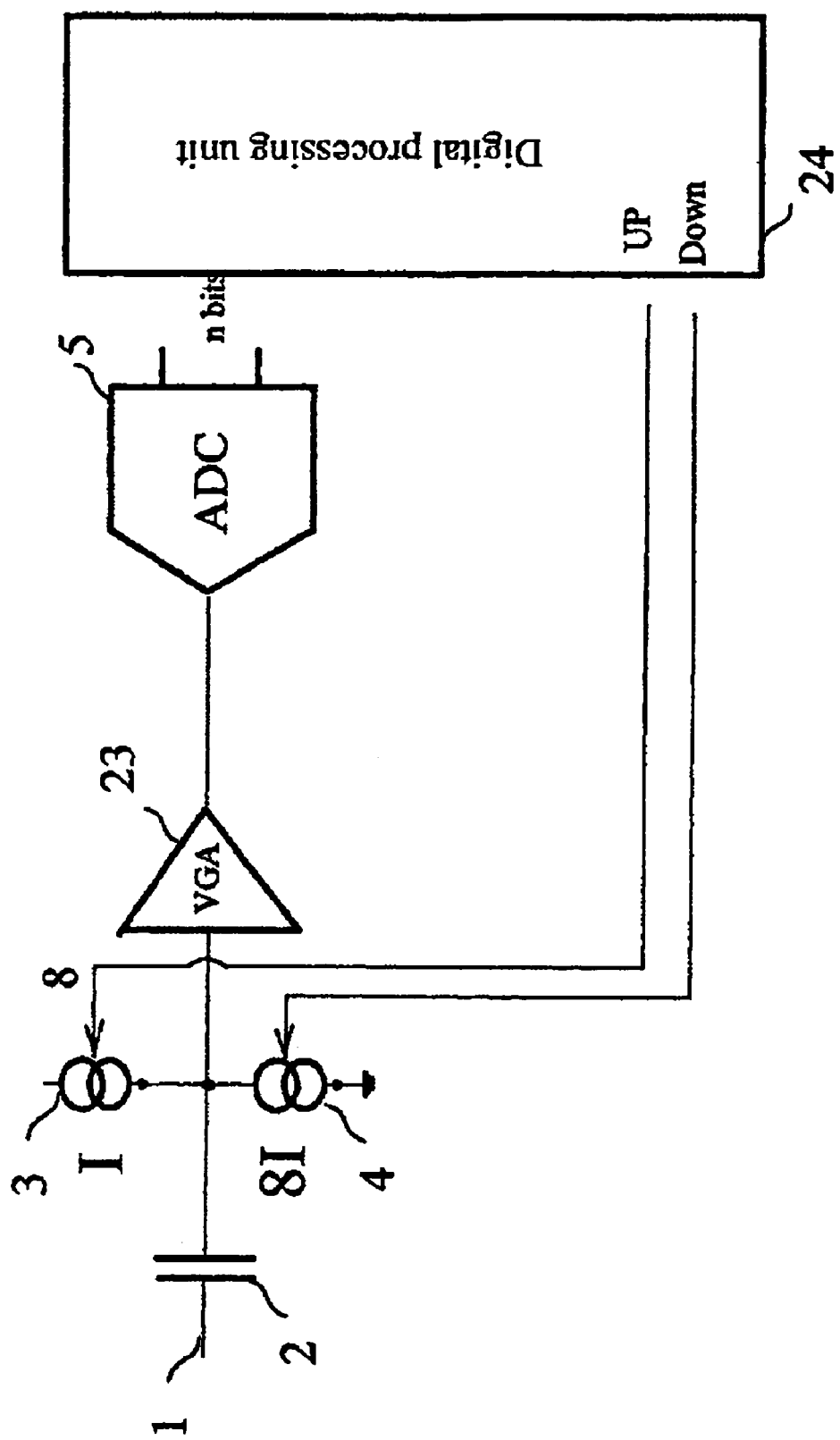
FIG. 2 illustrates a digital architecture of a calibration circuit.
Figure 3:
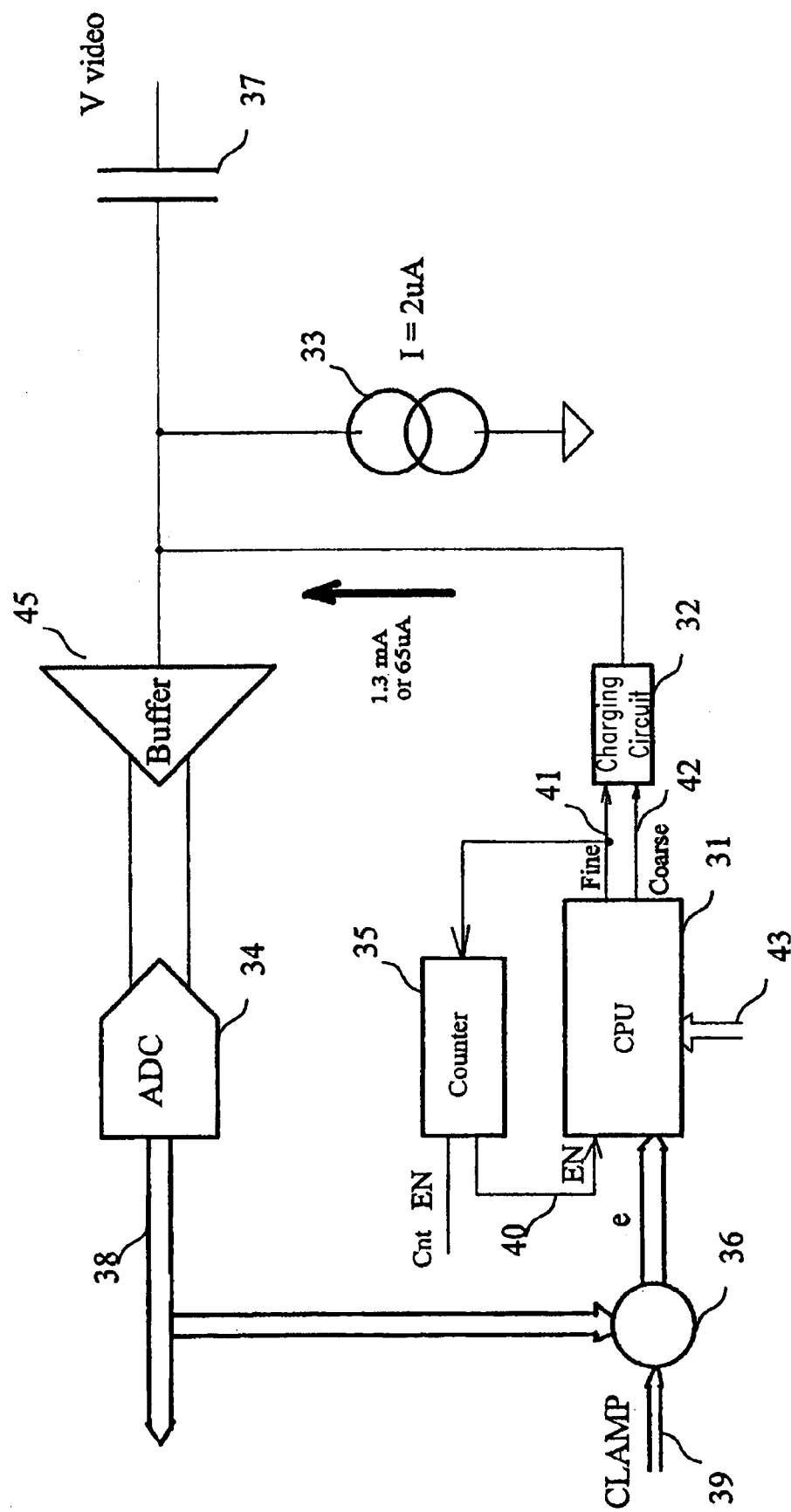
FIG. 3 illustrates one embodiment of the present invention.

FIG. 3 illustrates an embodiment of the present invention. The video signal is fed via a capacitor 37—having a value of 100 nF for example—into a buffer 45. The buffer—which could also be a variable gain amplifier—performs signal transformations, in particular impedance adaptation before analog-to-digital conversion. In an embodiment, buffer 45 also transforms the video signal into two differential analog components to present the signal to the input of an analog-to-digital converter 34 in differential mode. That way, the amplitude of analog signals around polarization points can be reduced and signal noise ratio and the linearity of the processing operations (and in particular Total Harmonic Distortion, T.H.D.) can be considerably increased. Generally, buffer 45 will not be further described because its physical realization will vary according to the application that is considered.

It is thus observed that, if one excepts buffer element 45 that simply transforms the signal, the latter is directly presented to A/D converter 34. From this point of view, it is thus observed that this embodiment has the advantages of an "all" digital processing. On the other hand, contrary to a conventional digital approach, it is not necessary to provide for sophisticated digital processing with extraction of the level of black. Indeed, according to the teaching of this invention, clamping of the video signal is realized by setting the voltage of the sync trough, which is carried out by means of a simple comparator 36 associated with a central processing unit 31 controlling a charging circuit 32 for supplying at least a first and a second charging current to capacitor 37.

In response to both differential components received, converter 34 provides a N-bit digital code, for example a twelve-bit code. The code is transmitted to a comparator 36 by means of a bus 38, and this comparator also receives a set point—known as CLAMP value—on a bus 39. The result from the comparison is transmitted to a central processing unit 31. The number of bits used to set the clamp makes it possible to set the adjustment step of the clamp voltage. Any useful arrangement needed to set the control range and the adjustment step of this clamp can advantageously be realized. In practice, in one embodiment, the clamp value is 7-bit long and a 4-bit shift towards the left is realized before comparison by comparator 36.

In this manner, for output codes from A/D converter 34 varying between 0 and 4095 (twelve-bit codes), the voltage of the sync trough will be set between 256 and 2032, by steps of sixteen. It will be apparent to people qualified in the art how to realize all useful arrangements to apply the teaching of this invention to the considered application and to the desired range of control. It is observed that in all cases, the circuit remains simple while allowing extremely precise adjustment, as will be seen in the following.

Central processing unit 31 receives the result of comparator 36 and, according to this result, generates two control signals, respectively COARSE and FINE on lines 41 and 42, according to the measured variation.

More particularly, if the variation between the output code from A/D converter 34 and CLAMP is noted e=Code−CLAMP, signal COARSE will be generated when:

$$e < -\text{THRESHOLD}$$

Conversely, signal FINE will be generated when:

$$-\text{THRESHOLD} < e < 0$$

When variation e is positive, none of signals COARSE and FINE is activated, so that a current is generated only when voltage has a lower value than the CLAMP voltage. It is a first advantage compared to known analog architectures since current stops being injected into capacitor 37 when the video signal voltage exceeds the CLAMP value.

Control signals FINE and COARSE, transmitted via lines 41 and 42 respectively, are used by current circuit 32 to generate at least a first and at least a second current with a very different value. In a mode of realization, control signal COARSE generates a current $I_{COARSE}$ having a value of 1.3 mA that is used to recharge capacitor 37. The FINE control signal generates a current $I_{FINE}$ flowing in the same direction as current $I_{COARSE}$, but having a much lower amplitude, for example 65 μA. Both currents $I_{COARSE}$ and $I_{FINE}$ are used to recharge capacitor 37 at different speeds, capacitor 37 being continuously discharged via a power source 33 of value 2 μA, as can be seen in FIG. 3. Depending on the case, the power source can be realized by means of a very simple circuit, or come down to a mere leakage current. Current values are selected to allow controlling the voltage of the sync trough at the input of A/D converter 34. These values can be modified according to the considered application and, more precisely, according to the characteristics of the desired control. Concretely, with the values of current that are indicated, it is observed that when the voltage of the video signal is below CLAMP−THRESHOLD, the central processing unit 31 generates a current COARSE having a large amplitude so as to rapidly increase the voltage of the sync trough towards the desired clamp value. This control mode will intervene during circuit start transient, when video input voltage is not yet perfectly regulated. On the other hand, from the moment the sync trough voltage is stabilized and close to the clamp value, central processing unit 31 produces only a FINE control signal compensating for the weak loss of current due to power source 33.

Thus, it is observed that, contrary to conventional I-8Istructure with its continuous oscillation around the clamp value, the current circuit of an embodiment of the present invention stops providing a current $I_{COARSE}$ or $I_{FINE}$ when the voltage of the video signal exceeds the clamp value, which is in particular the case when the signal carries useful information. The circuit of an embodiment of the invention thus differs radically from the conventional structure in that it allows true control with a high degree of accuracy (fixed to 12 bits here), and with no need to extract the level of black. It is observed that central processing unit 31 is particularly not expensive to implement, just as current circuit 32.

Figure 4:
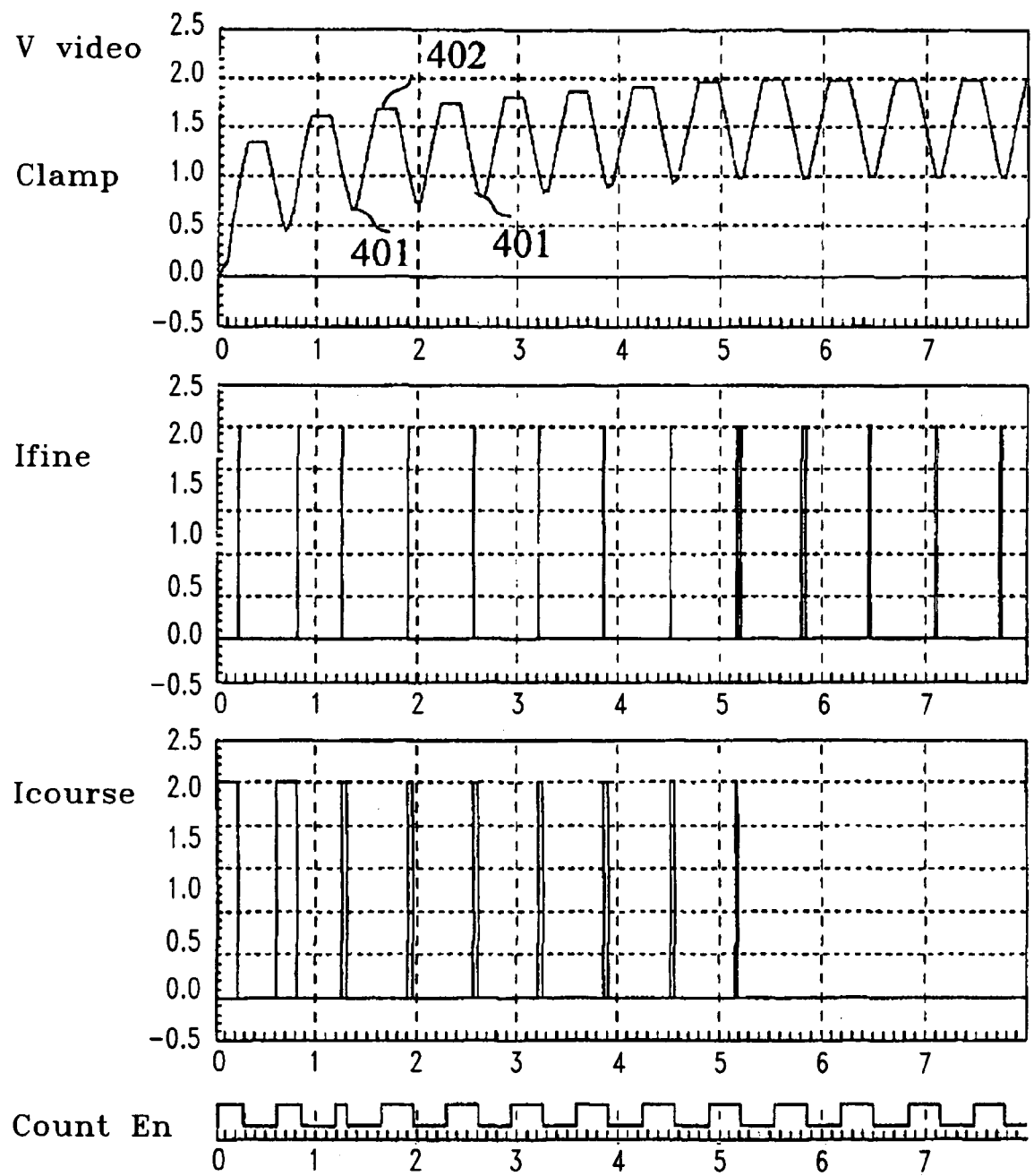
FIG. 4 illustrates example chronograms of signals representative of the operation of the circuit in FIG. 3.

FIG. 4 shows a simulation illustrating the operation of the circuit for positioning the sync trough, and in particular, voltages of the input video signal, currents $I_{COARSE}$ and $I_{FINE}$, and output EN from a counting unit 35, whose operation is detailed hereafter. When examining the first curve representative of the input video signal, one sees the sync troughs 401 and one notes that the voltage of this sync trough is controlled until it reaches the clamp value (set to voltage 1 Volt as can be seen in FIG. 4). It is noted that as long as this voltage stays much below this clamp value, impulses $I_{COARSE}$ appear (precisely as long as the voltage remains lower than 0.97 Volt in FIG. 4) that tend to disappear when stable control mode is reached.

Thus, a two-speed control is realized that is easy to implement and is particularly effective. Moreover, it is extremely flexible since the COARSE and FINE adjustment ranges can be precisely set, by means of the adjustment value carried on bus 43. Thus, various zones can be controlled in a precise manner, with the advantages of fast control resulting from current $I_{COARSE}$ and precision provided by current $I_{FINE}$. In a particular embodiment, a charging circuit 32 providing three currents or more could also be considered. Clearly, an already very satisfactory result is achieved with two power sources, which allow fast establishment of a steady state—thanks to source $I_{COARSE}$, followed by an extremely precise fine control mode since—in one embodiment—control is realized based on a twelve-bit accuracy. If the clamp value of CLAMP is set to 2032 for example, a control between 2031 and 2033 will be obtained. Thus, fast control at the time of the start transient is observed and this constitutes a second advantage compared to known conventional analog architectures.

We will now describe an optional improvement to the basic device, which makes it possible to disregard some parasitic signals that are likely to appear during the usable video signal, and that could somehow disturb the operation of the circuit as described. Indeed, during the video signal, for various reasons, negative impulses (which are absent from the ideal simulation of FIG. 4 as can be seen) could occur that could cause generation of stray currents for $I_{FINE}$ and even $I_{COARSE}$.

To this end, central processing unit 31 has an ENABLE input that makes it possible to inhibit the generation of control signals COARSE and FINE. Counting unit 35 receiving a clock signal (not represented) also has an input COUNT ENABLE making it possible to inhibit its operation. Counting unit 35 receives the FINE control signal generated by unit 31 and is reset with each impulse of this control signal. If the counter is clocked by a 27 MHz clock, for example, a 64-microsecond line will result in approximately 1728 clock pulses. Counting unit 35 is positioned to present a control signal onto line 40 that has a logical level 1 during the first 128 clock impulses, which corresponds to a time duration of approximately 5 μS. On passing of value 128, the output EN on line 40 switches to 0, and the counter continues to count until, for example, it arrives at value 1024 whereupon it will be reset. Counting unit 35 will restart counting on a rising impulse of the FINE control signal. It is noted that a window is thus created, allowing to produce a high logical signal on line 40 during sync trough of the video signal.

In this manner it is assured that central processing unit 31 generates control signals COARSE and FINE only during this period, and that nothing will disturb the adjustment of the clamp value during presentation of the video signal to analog-to-digital converter 34.

Figure 5:
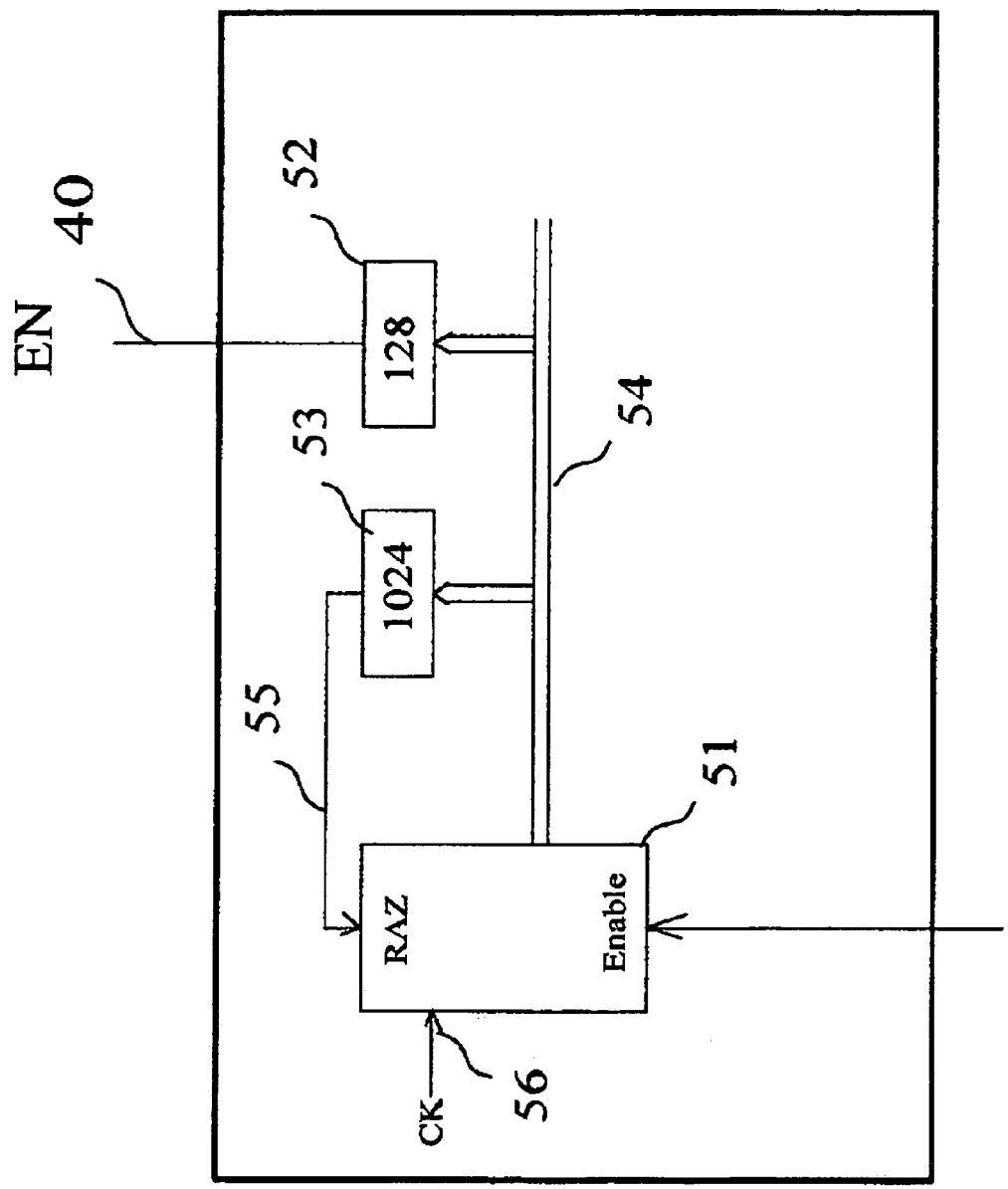
FIG. 5 illustrates details of the structure and operation of a counting unit according to an embodiment of the invention.

FIG. 5 shows details of the structure and operation of counting unit 35. A counter 51 receives a clock signal on an input CK 56 and has a count value that is transmitted to a first decoder circuit 52 and a second decoder circuit 53, respectively. Decoder circuit 52 decodes the code 128 appearing on the output of counter 51 and second decoder circuit 53 decodes code 1024. The output of the first decoder circuit 52 provides a low logical signal when the counter reaches value 128 while the output of second decoder circuit 53 is used to reset counter 51, which is authorized to count upon the appearance of a rising edge in signal FINE.

The embodiment was described in relation with a capacitor 37 charged by charging circuit 32, respectively with a current $I_{COARSE}$ or $I_{FINE}$, for compensating for current discharge caused by source 33. People qualified in the art could readily adapt the structure of the circuit in FIG. 3 in order to reverse currents. In that case, the operation of central processing unit 31 would be reversed. The last chronogram in FIG. 4 illustrates output logical signal EN from counter 35, counter 35 being activated by a high logical signal presented to its input COUNT EN.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A calibration device for a video circuit input stage, comprising:
   an input capacitor to receive a video signal;
   a charging circuit to generate at least a first and a second current to charge said capacitor, and controlled by at least a first and a second control signal, respectively;
   a current source to continuously discharge said capacitor;
   a video signal transform stage;
   an analog-to-digital converter to generate a digital output code in response to said video signal;
   a comparator to compare said converter's output code with a clamp value; and
   a central processing unit to generate said control signals from a variation between said code and said clamp value.

2. The calibration device according to claim 1 wherein said first charging current has a value to allow to rapid recharge of said capacitor, and wherein said second charging current has a value to allow slow recharge of said capacitor.

3. A device according to claim 2 wherein said central processing unit generates said first control signal when the output code of said analog-to-digital converter is lower than said clamp value received by said comparator by more than one given threshold.

4. A device according to claim 3 wherein said central processing unit generates said second control signal when the output code of said analog-to-digital converter is lower than said clamp value received by said comparator, while remaining close to said clamp value.

5. A device according to claim 4 wherein the first control signal is generated when $$e < -THRESHOLD$$

with e=Code−CLAMP, where Code is the output of the converter; THRESHOLD is a value corresponding to said threshold and CLAMP is the clamp value received by the comparator; and wherein
the second control signal is generated when $$-THRESHOLD < e < 0.$$

6. A device according to claim 5, further comprising a counting unit to receive said second control signal and to block generation of said first and said second control signals after the expiry of a time after appearance of said second control signal.

7. A device according to claim 1 wherein the current source supplies a current of 2 μA, and wherein said charging circuit supplies two currents, respectively of 1.3 mA or 65 μA.

8. A calibration device for a video circuit input stage, comprising:
   an input capacitor to receive a video signal;
   a charging circuit to generate at least a first and a second current to discharge said capacitor, and controlled by at least a first and a second control signal, respectively;
   a current source to continuously charge said capacitor;
   a video signal transform stage;
   an analog-to-digital converter to generate a digital output code in response to said video signal;
   a comparator to compare said converter's output code with a clamp value; and
   a central processing unit to generate said control signals from a variation between said code and said clamp value.

9. A calibration device according to claim 8 wherein said first discharging current has a value to allow to rapid discharge of said capacitor, and wherein said second discharging current has a value to allow slow disoharge of said capacitor.

10. A device according to claim 9 wherein said central processing unit generates the first control signal when the output code of said analog-to-digital converter is higher than the clamp value received by said comparator by more than one threshold.

11. An apparatus, comprising:
   a capacitor to receive a video signal;
   a circuit coupled to the capacitor to generate at least a first current and a second current both to charge the capacitor, the generation of the first and second currents being controlled by at least a first and a second control signal, respectively;
   a converter coupled to the capacitor to generate an output corresponding to the video signal;
   a comparator coupled to the converter to compare the output of the converter with a clamp value; and
   a processor unit coupled to the comparator to generate the first and second control signals based on a variation determined by the comparator between the output of the converter and the clamp value.

12. The apparatus of claim 11 wherein the first current has a value to charge the capacitor at a first recharge rate, and wherein the second current has a value to charge the capacitor at a second recharge rate that is slower relative to the first recharge rate.

13. The apparatus of claim 11, further comprising a current source coupled to the capacitor to continuously discharge the capacitor.

14. The apparatus of claim 11, further comprising a transform stage coupled to the capacitor to transform the video signal and coupled to provide the transformed video signal to the converter.

15. The apparatus of claim 11 wherein the processor unit is coupled to generate the first control signal if the output of the converter is lower than the clamp value by more than one threshold.

16. The apparatus of claim 15 wherein the processor unit is coupled to generate the second control signal if the output of the converter is lower than the clamp value, while remaining close to the clamp value.

17. The apparatus of claim 11, further comprising a counter unit coupled to the processor unit to receive the second control signal and to block generation of the first and second control signals after expiration of a time after appearance of the second control signal.

18. The apparatus of claim 11 wherein the circuit is further coupled to the capacitor to generate at least the first and second currents to discharge the capacitor.

19. The apparatus of claim 18, further comprising a current source coupled to the capacitor to charge the capacitor, if the first and second currents discharge the capacitor.

20. A calibration method for a video circuit input stage, the method comprising:
receiving a video signal at a capacitor;
generating at least a first current and a second current that both charges, or that both discharge the capacitor, and controlling the generation of the first and second currents by at least a first and a second control signal, respectively;
generating an output code in response to the video signal;
comparing the output code with a clamp value; and
generating the first and second control signals from a variation between the compared output code and the clamp value.

21. The method of claim 20, further comprising continuously discharging the capacitor if the first and second currents charge the capacitor.

22. The method of claim 20 wherein generating the first control signal includes generating the first control signal if the output code is lower than the clamp value by more than one threshold, if the first and second currents charge the capacitor.

23. The method of claim 20 wherein generating the first control signal includes generating the first control signal if the output code is higher than the clamp value by more than one threshold, if the first and second currents discharge the capacitor.

24. The method of claim 20 wherein generating the first and second currents that both charge, or that both discharge, the capacitor includes generating the second current to charge or discharge the capacitor at a slower charge or discharge rate, respectively, relative to the first current.

25. The method of claim 20, further comprising blocking generation of the first and second control signals after expiration of a time after appearance of the second control signal.

26. The method of claim 20, further comprising charging the capacitor, if the first and second currents discharge the capacitor.

* * * * *

UNITED STATES PATENT AND TRADEMARK OFFICE
CERTIFICATE OF CORRECTION

PATENT NO. : 7,092,039 B2  
APPLICATION NO. : 10/356350  
DATED : August 15, 2006  
INVENTOR(S) : Lionel Grillo Page 1 of 1

It is certified that error appears in the above-identified patent and that said Letters Patent is hereby corrected as shown below:

Column 8  
Line 36, "disoharge" should read as --discharge--

Column 9  
Line 28, "charges" should appear as --charge--

Signed and Sealed this

Sixth Day of March, 2007

JON W. DUDAS  
*Director of the United States Patent and Trademark Office*